United States Patent
Yin et al.

(10) Patent No.: US 8,643,061 B2
(45) Date of Patent: Feb. 4, 2014

(54) STRUCTURE OF HIGH-K METAL GATE SEMICONDUCTOR TRANSISTOR

(75) Inventors: Haizhou Yin, Poughkeepsie, NY (US);
Dae-Gyu Park, Poughquaq, NY (US);
Oleg Gluschenkov, Tannersville, NY (US); Zhijiong Luo, Beijing (CN);
Dominic Schepis, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 12/908,024

(22) Filed: Oct. 20, 2010

(65) Prior Publication Data

US 2012/0098067 A1    Apr. 26, 2012

(51) Int. Cl.
*H01L 29/66*    (2006.01)

(52) U.S. Cl.
USPC ............ 257/192; 257/19; 257/347; 257/288; 438/197; 438/154; 438/938

(58) Field of Classification Search
USPC .............. 257/E27.112, E27.062, E29.287, 257/E31.035, E29.104, E29.193, 351, 369, 257/213, 900, 901, 902, 903, 347, 349, 288, 257/401, 18, 19, 20, 206, 350, 204, 192; 438/135, 142, 149, 166, 295, 292, 308, 438/311, 404, 413, 458, 459, 479, 481, 967, 438/151, 153, 154, 157, 405, 197, 938, 218, 438/229, 221, 222, 285, 299, 300, 301, 303
See application file for complete search history.

(56) References Cited

U.S. PATENT DOCUMENTS

| | | | |
|---|---|---|---|
| 7,524,740 B1 * | 4/2009 | Liu et al. | 438/479 |
| 2004/0126958 A1 * | 7/2004 | Usuda et al. | 438/217 |
| 2005/0164433 A1 * | 7/2005 | Doris et al. | 438/149 |
| 2005/0285187 A1 * | 12/2005 | Bryant et al. | 257/335 |
| 2007/0254423 A1 * | 11/2007 | Chidambarrao et al. | 438/197 |
| 2007/0257249 A1 * | 11/2007 | Mocuta et al. | 257/19 |

OTHER PUBLICATIONS

Park et al. "Thermally robust dual-work function ALD-MN MOSFET's using conventional CMOS process flow", 2004 Symposium on VLSI Technology, Digest of Technical Papers, 2004 IEEE., p. 186-187.
Narayanan et al. "Band-Edge High-Performance High-k/Metal Gate n-MOSFET's using Cap Layers Containing IIA and IIB Elements with Gate-First Processing for 45 nm and Beyond".
Chudzik et al. "High-Performance High-k/Metal Gates for 45nm CMOS and Beyond with Gate-First Processing", 2007 Symposium on VLSI Technology Digest of Technical Papers, p. 194-195.

(Continued)

*Primary Examiner* — Thanh Y Tran
(74) *Attorney, Agent, or Firm* — Yuanmin Cai

(57) ABSTRACT

A semiconductor structure is provided. The structure includes an n-type field-effect-transistor (NFET) being formed directly on top of a strained silicon layer, and a p-type field-effect-transistor (PFET) being formed on top of the same stained silicon layer but via a layer of silicon-germanium (SiGe). The strained silicon layer may be formed on top of a layer of insulating material or a silicon-germanium layer with graded Ge content variation. Furthermore, the NFET and PFET are formed next to each other and are separated by a shallow trench isolation (STI) formed inside the strained silicon layer. Methods of forming the semiconductor structure are also provided.

20 Claims, 8 Drawing Sheets

(56) References Cited

OTHER PUBLICATIONS

Greene et al. "High-Performance 32nm SIO CMOS with High-k/Metal Gate and 0.149um SRAM and Ultra Low-k Back End with Eleven Levels of Copper".

Park et al. "High-k/Metal Gate Low Power Bulk Technology—Performance Evaluation of Standard CMOS Logic Circuits, Microprocessor Critical Path Replicas, and SRAM for 45nm and beyond", p. 90-92.

* cited by examiner

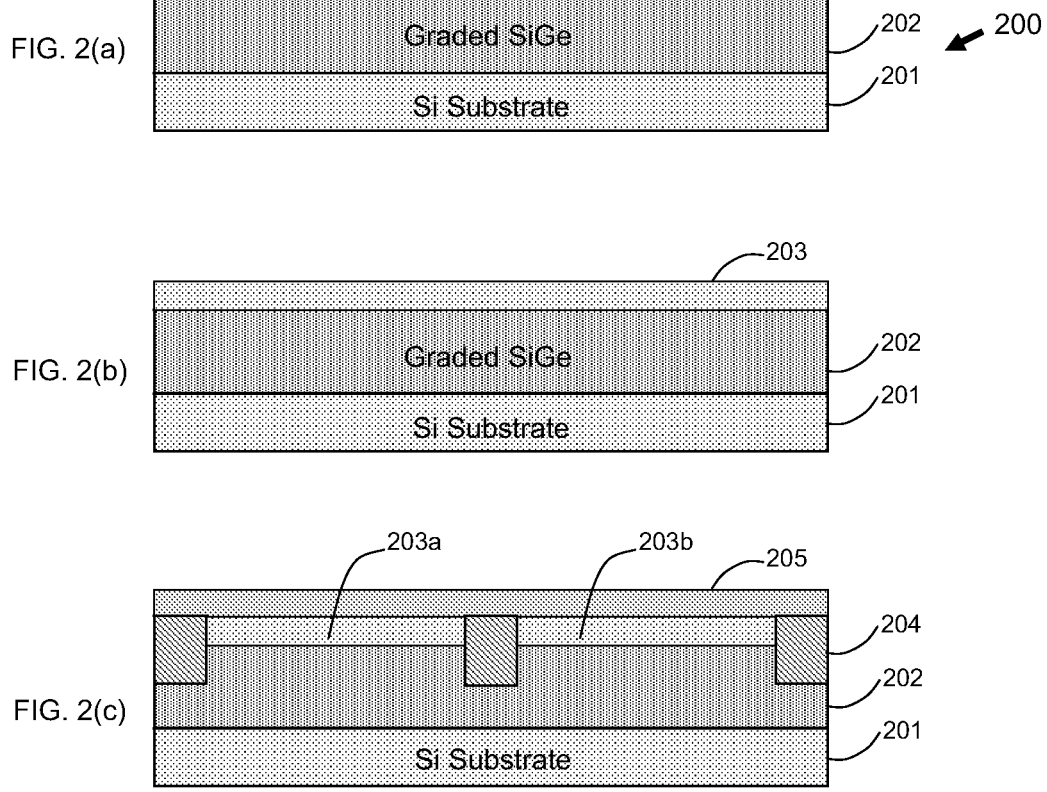

STRUCTURE OF HIGH-K METAL GATE SEMICONDUCTOR TRANSISTOR

FIELD OF THE INVENTION

The present invention relates to the field of semiconductor device manufacturing. In particular, it relates to structures of field-effect-transistors and method of manufacturing thereof.

BACKGROUND

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically, for example, a complementary metal-oxide-semiconductor field-effect-transistor (CMOS-FET). A FET may further be a p-type dopant doped PFET or an n-type dopant doped NFET. Same or different types of transistors may be made or formed on a common substrate or chip, such as a silicon substrate.

Recently, high-k metal gate (HKMG) semiconductor transistors have been introduced for their superior performance over conventional poly/SiON-based CMOS-FET. Detailed description of performance of various HKMG transistors may be found in many publications such as, for example, D. G. Park et al., VLSI Tech. Dig. (2004); V. Narayanan et al., VLSI Tech Dig (2006); Chudzik et al, VLSI Tech. Digest (2007); B. Greene et al. VLSI tech. Dig. (2009); and D.-G. Park, VLSI-TSA (2009); all of which are incorporated herein by references in their entireties. On the other hand, some issues/concerns still remain with and need to be addressed and resolved for HKMG transistors. For example, so far threshold voltage (Vt) of a HKMG FET, whether NFET or PFET, has been typically higher than what would be considered as preferable or ideal due to limited availability of suitable metal gate material. Difficulty is generally acknowledged in finding metals with appropriate band-edge for forming the gate, especially those metals that are thermally stable and able to withstand process conditions of a conventional transistor formation flow. For example, it is difficult to find a metal gate material that is thermally stable and has a work-function close enough to the valence band-edge (4.05 eV) and/or conduction band-edge (5.15 eV) of the commonly used silicon (Si) substrate.

Various attempts have been made in order to lower the threshold voltage Vt of HKMG FET. One method includes using a dipole layer, such as a lanthanum oxide or magnesium oxide layer, at the interface between gate dielectric and the silicon substrate. However, in association with the use of a dipole layer, degradation of electron mobility have been observed that may have been caused by dipole inducing phonon scattering and/or interface scavenging during the dipole layer formation. Usually, the thicker the dipole layer is, the worse the degradation becomes.

SUMMARY OF THE INVENTION

Embodiment of the present invention provides a semiconductor structure. The semiconductor structure may include high-k metal gate field-effect-transistors. The semiconductor structure may include an n-type field-effect-transistor (NFET) being formed directly on top of a strained silicon layer, the strained silicon layer being formed directly on top of a layer of insulating material; and a p-type field-effect-transistor (PFET) being formed on top of the stained silicon layer via a layer of silicon-germanium (SiGe), wherein the NFET and PFET are separated by a shallow trench isolation (STI) formed inside the strained silicon layer.

In one embodiment, the strained silicon layer may be a biaxial-strained silicon layer with approximately 0.8% tensile strain, and may have a thickness between about 4 nm and about 30 nm.

In another embodiment, the layer of insulating material may be a layer of oxide.

In yet another embodiment, the layer of SiGe may be doped with carbon, and may for example, contains about 55% Ge.

Embodiment of the present invention also provides a semiconductor structure which may include an n-type field-effect-transistor (NFET) being formed on top of a strained silicon layer, the strained silicon layer being formed directly on top of a graded silicon-germanium (SiGe) layer; and a p-type field-effect-transistor (PFET) being formed on top of the stained silicon layer via a layer of silicon-germanium (SiGe), wherein the NFET and PFET are separated by a shallow trench isolation (STI) formed inside the strained silicon layer and the graded SiGe layer.

BRIEF DESCRIPTION OF THE DRAWINGS

The invention will be understood and appreciated more fully from the following detailed description of preferred embodiments, taken in conjunction with the accompanying drawings of which:

FIGS. 2(a)-2(f) are demonstrative illustrations of cross-sectional views of a method of forming semiconductor structure 200 according to another embodiment of the invention;

Figure 1A:
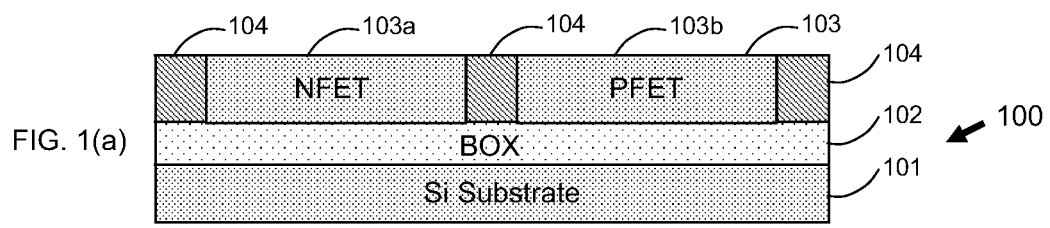
FIGS. 1(a)-1(f) are demonstrative illustrations of cross-sectional views of a method of forming semiconductor structure 100 according to one embodiment of the invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIGS. 1(a)-1(f) are demonstrative illustrations of cross-sectional views of a method of forming a semiconductor structure 100 according to an embodiment of the present invention. As a non-limiting example, semiconductor structure 100 may include high-k metal gate semiconductor transistors.

More specifically, one embodiment of present invention provides a method that may include forming semiconductor structure 100 on a substrate such as, for example, a silicon substrate 101 as being illustrated in FIG. 1(a). Other types of substrates or semiconductor substrates may be used as well according to embodiments of the present invention. On top of silicon substrate 101 a layer of insulator or insulating material 102 may be formed. Insulating layer 102 may be formed through existing or future developed semiconductor manufacturing processes such as, for example, a chemical vapor deposition (CVD) process. Insulating layer 102 may be, for example, a layer of oxide or other suitable insulating materials. In cases where insulating layer 102 is an oxide layer, as being assumed hereinafter for the sole purpose of description without limitation, insulating layer 102 may be referred to as a buried oxide layer (BOX).

According to one embodiment, the method may also include forming a layer of strained silicon material 103 directly on top of insulating layer 102, thereby creating a layered structure of strained silicon directly on insulator (SS-DOI). Strained silicon layer 103 may cover areas that are designated for forming n-type FET (NFET) or p-type FET (PFET), and preferably have a thickness between about 4 nm to about 30 nm. The NFET forming area, for example area 103a, and PFET forming area, for example area 103b, may be separated and/or defined by one or more shallow-trench-isolation (STI) regions such as STI 104, as illustrated in FIG. 1(a). STI 104 may be formed through a conventional lithographic patterning and CVD deposition process and may be formed, in one embodiment, inside strained silicon layer 103, and through thereof, to be in contact with insulating layer 102.

An n-type FET, or NFET, may be formed directly on top of strained silicon layer 103a as being described later in more detail with reference to FIG. 1(f). According to one embodiment of the present invention, a lower threshold voltage (Vt) may be achieved for an NFET that is formed on top of a strained silicon layer and in particular a layer of strained silicon directly on insulator (SSDOI). More specifically, it has been found that using a strained silicon layer with about 0.8% strain, which is measured with respect to substrate 101, may result in a reduction of approximately 100 mV in threshold voltage of a NFET formed thereupon when being compared with a NFET formed on top of an unstrained silicon layer with the same metal gate material. This reduction in threshold voltage may be attributed to a lowered conduction band-edge of the strained silicon material, considered to be caused by an increase in the in-plan lattice constant. More specifically, as an example, if a biaxial-strained silicon layer is used, a 0.8% tensile strain inside the silicon layer may create certain amount of increase in the in-plan lattice constant which in-turn results in a reduction in conduction band-edge of around 150 mV.

So far, a dipole layer, for example those made from oxide of element in group IIA or group IIIB in the periodic table such as LaO, MgO, or BaO, has been used to lower the threshold voltage Vt of a NFET transistor formed on silicon substrate. The reduction in Vt brought by the use of strained silicon layer may provide certain relief by lessening the need for the required thickness of the dipole layer, even if such a dipole layer may still be needed for further Vt adjustment. Because electron mobility in high-k metal gate usually degrades when a dipole layer is used, the less thickness (therefore less use) of the dipole layer, the less impact electron mobility may suffer caused by the dipole layer.

Figure 1B:
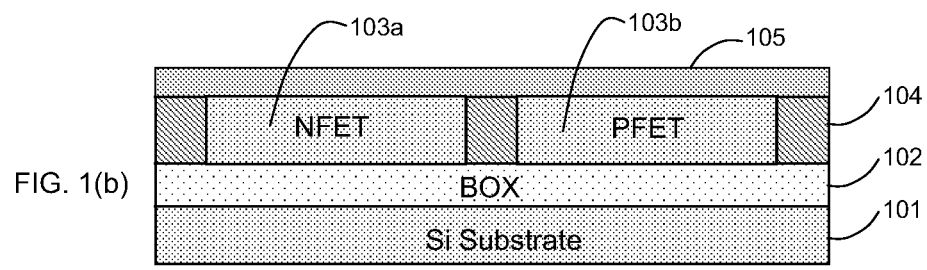

In order to form both NFET and PFET on top of strained silicon layer 103 in their respective designated areas 103a and 103b, in one embodiment, the method may include forming a hard-mask layer 105 of high temperature oxide (HTO) or other suitable hard-mask material on top of strained silicon layer 103, as well as STIs 104, as illustrated in FIG. 1(b). HTO hard-mask layer 105 is provided mainly to facilitate difference in process flows and/or process conditions of forming NFET and PFET on the same substrate. For example, during process, area 103b, which is designated for forming PFET, may be exposed by removing HTO hard-mask layer 105 on top thereof to facilitate a step or steps specifically designed for forming PFET, while HTO hard-mask layer 105 on top of area 103a, which is designated for forming NFET, may be kept to cover the underneath strained silicon layer.

Figure 1C:
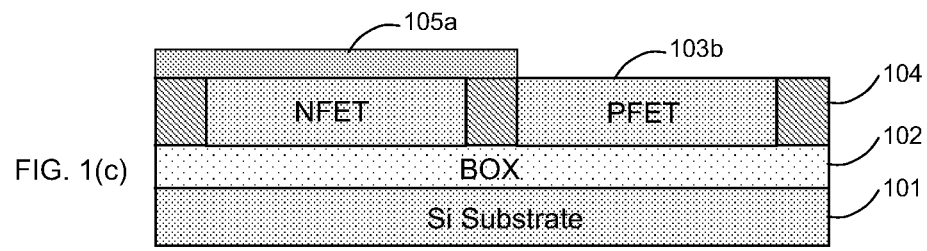

As is illustrated in FIG. 1(c), according to one embodiment, HTO hard-mask layer 105 on top of area 103b may be removed. The removal may be made by applying a photo-lithographic process to form a photo-resist pattern on top of HTO hard-mask layer 105 (not shown) that exposes only this particular portion of HTO hard-mask layer 105, and subsequently removing this exposed HTO hard-mask layer 105 through an etching process to expose the underneath area 103b of strained silicon layer 103. Area 103a of strained silicon layer 103 remains covered by the rest of HTO hard-mask layer 105. The photo-resist pattern is then removed.

Figure 1D:
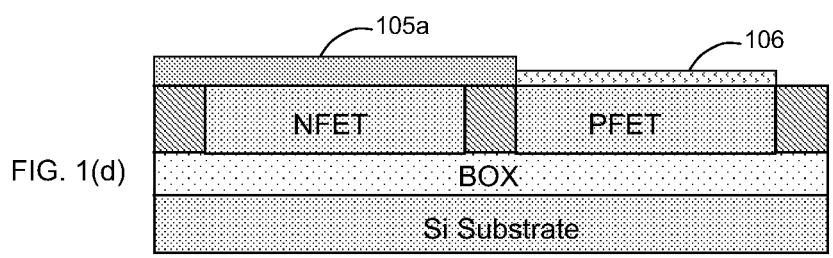

In order to form PFET, a silicon-germanium layer may then be formed on top of area 103b. For example, embodiment of the present invention may include forming or growing, epitaxially, a channel silicon-germanium (cSiGe) layer 106 on the exposed PFET forming area 103b of strained silicon layer 103 as shown in FIG. 1(d). The cSiGe layer 106 may only grow on top of strained silicon region 103b and therefore self-aligned to strained silicon region 103b, and not on exposed STI areas that are not silicon based. The cSiGe layer 106 may or may not be doped with carbon.

According to one embodiment of the present invention, use of a strained silicon layer as a base to form a channel silicon-germanium (channel SiGe or cSiGe) layer thereupon helps improve capacity of incorporating more germanium (Ge) content without causing apparent increase in defects in the formed SiGe layer. This is because lattice constant of a strained silicon layer is generally larger than that of an unstrained silicon layer. This increase in lattice constant enables the growth of a SiGe layer that incorporates more Ge content with relatively less defects, when being compared with the level of defects of a SiGe layer that has the same amount of Ge content and is grown on top of an unstrained silicon layer. Generally, a channel SiGe layer with higher Ge content is favorable for a p-type FET, or PFET, formed thereupon because a higher Ge content generally is associated with a lower valance band-edge and therefore a lowered threshold voltage Vt of the PFET. On the other hand, the higher the Ge content is, normally the more defects (such as misfit dislocation and threading dislocation) there will be in the formed SiGe layer, which may ultimately limit the level of Ge content that may be incorporated in the formed SiGe layer. The formation of SiGe layer on top of a strained silicon layer provides an effective way to increase the content of Ge in the SiGe layer without causing significantly increase in the defect rate.

For example, forming a 55% SiGe layer, which has fifty-five (55) atomic percent of Ge content and may be noted as $Si_{0.45}Ge_{0.55}$, on a strained silicon layer may produce or introduce a level of strain that may be comparable or equivalent to that of forming a 25% SiGe ($Si_{0.75}Ge_{0.25}$) layer on an unstrained silicon layer. In other words, with the same amount of strain being introduced, which is related to the level of tolerable defects, more Ge may be incorporated in the formed SiGe layer that is formed on top of a strained silicon layer than on an unstrained silicon layer. The 55% SiGe layer (formed on a strained silicon layer) may contain more effective Ge, close to 30%, than that of the 25% SiGe layer (formed on an unstrained silicon layer) that contributes to the reduction in valance band-edge of the SiGe layer and therefore the reduction in threshold voltage Vt of the PFET thereupon.

More specifically, a 50% SiGe layer formed on a 0.8% strained silicon layer may achieve a reduction of about 350 mV in valance band-edge of the formed SiGe layer. This translates into a reduction of threshold voltage of about 350 mV for a PFET formed thereupon, without counting any Vt shift which may be caused by gate capacitance and may further reduce threshold voltage of the PFET.

Embodiments of the present invention provide a method that may include forming a channel SiGe layer containing a Ge content ranging from about 25% to about 55% in atomic percentage and preferably around 55%. The channel SiGe layer (cSiGe) 106 formed on strained silicon layer 103b may therefore have an effective Ge content, up to 30%, to help lower the threshold voltage Vt of PFET 107b formed thereupon in a later step and achieve higher hole mobility. The channel SiGe layer 106 is preferably formed to have a thickness about 3 nm to about 15 nm with a thinner cSiGe being generally preferred for better electrostatic and/or short channel control. As being illustrated in FIG. 1(d), the remaining HTO hard-mask 105a covers at least those NFET forming area 103a, and may cover some or all STI areas as well. However, the covering of STIs 104 is optional since, as being described above, SiGe does not grow on top of STIs.

The formation of SiGe or carbon-doped SiGe (SiGe:C) is relatively easier on top of strained silicon layer (SSDOI) 103b than on top of an unstrained silicon layer. For example, with a 55% SiGe layer the critical thickness, beyond which misfit dislocation and/or defects may start to occur, is around 3.5 nm, and with a 25% SiGe, the critical thickness increases to about 10 nm. In both cases, it is easier to grow SiGe having higher Ge content on strained SOI substrate than on non-strained silicon.

Figure 1E:
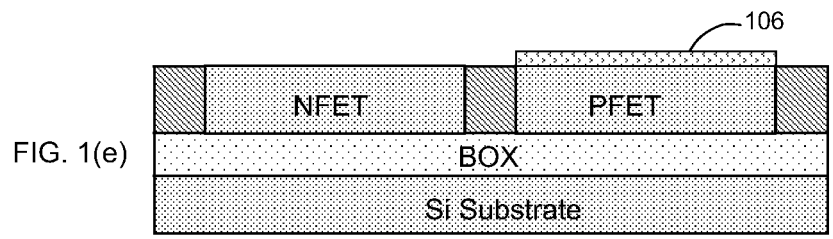
Figure 1F:
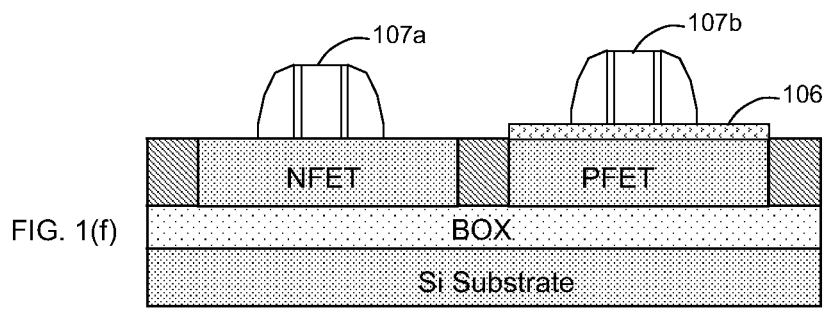

After cSiGe layer 106 is epitaxially formed on top of the PFET forming area 103b of strained silicon layer 103, HTO hard-mask layer 105a that remains coving the top of NFET forming area 103a (as well as other STI areas) may be removed, as being illustrated in FIG. 1(e), to expose the NFET forming area 103a. Subsequently, gate structures, including NFET gate structure 107a and PFET gate structure 107b, may be formed directly on top of strained silicon layer 103 in the NFET forming area 103a, and on top of strained silicon layer 103 via cSiGe layer 106 in the PFET forming area 103b, as being illustrated in FIG. 1(f). Gate structures 107a and 107b may be similar to those that are otherwise known in the art, having at least a gate stack and spacers at sidewalls of the gate stack.

Figure 2D:
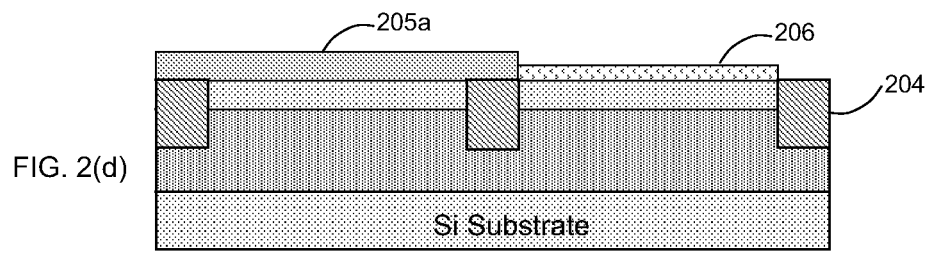
Figure 2E:
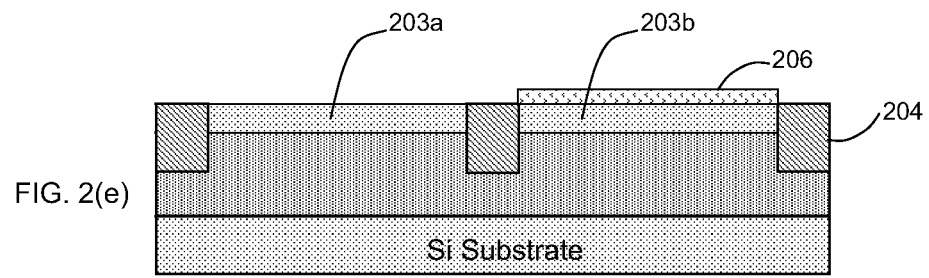

FIGS. 2(a)-2(f) are demonstrative illustrations of cross-sectional views of a method of forming semiconductor structure 200 according to another embodiment of the invention. As a non-limiting example, semiconductor structure 200 may be, for example, high-k metal gate semiconductor transistors. According to one embodiment, the method may include forming a graded SiGe layer 202 on top of silicon (Si) substrate 201 as illustrated in FIG. 2(a). The graded SiGe layer 202 may be formed to have a Ge content that gradually increases toward its top surface away from its interface with the Si substrate 201. The amount of Ge content and the change of grade may be determined by the desired amount of PFET threshold voltage shift. Using graded SiGe, the amount of Ge in SiGe can be easily adjusted without causing defect formation. The graded SiGe layer 202 may have a thickness preferably ranging from 4 nm to 80 nm, with 10-75% atomic Ge content at the top surface.

A strained silicon layer 203 may be formed or deposited on top of graded SiGe layer 202 as being illustrated in FIG. 2(b). Shallow trench isolations (STIs) 204 may be formed inside strained silicon layer 203, and possibly into graded SiGe layer 202, which may divide strained silicon layer 203 into NFET forming area 203a and PFET forming area 203b, as being illustrated in FIG. 2(c). Next, in order to facilitate the formation of both NFET and PFET on a same substrate, hard-mask layer 205 such as a layer of high temperature oxide (HTO) may be formed such as through deposition to initially cover both strained silicon regions 203a and 203b.

According to one embodiment, in order to accommodate a step or steps of forming PFET, a portion of hard-mask layer 205 may be subsequently removed to expose area 203b designated for forming PFET, leaving only 205a to cover NFET forming area 203a. Following the above step, the rest steps of forming semiconductor structure 200 may be more or less similar to those already illustrated in FIG. 1(d), 1(e), and 1(f). For example, embodiments of the present invention may include forming a channel SiGe (cSiGe) layer 206 epitaxilly on top of strained silicon layer 203 in the PFET forming area 203b as being illustrated in FIG. 2(d); subsequently removing the remaining hard-mask layer 205a to expose NFET forming area 203a as being illustrated in FIG. 2(e); and forming gate structures 207a and 207b either directly on top of strained silicon layer 203a (for NFET), or indirectly via the cSiGe layer 206 (for PFET) as being illustrated in FIG. 2(f). The use of strained silicon layer 203 underneath cSiGe layer 206 helps create a higher effective Ge content in the channel regions, which helps in reducing threshold voltage of the PFET formed in the 203b region.

With the use of combination of strained silicon layer 203 and graded SiGe layer 202 underneath thereof, embodiment of the present invention provides a method of manufacturing HKMG FETs whose threshold voltage Vt may be reduced as well as shifted.

Figure 2F:
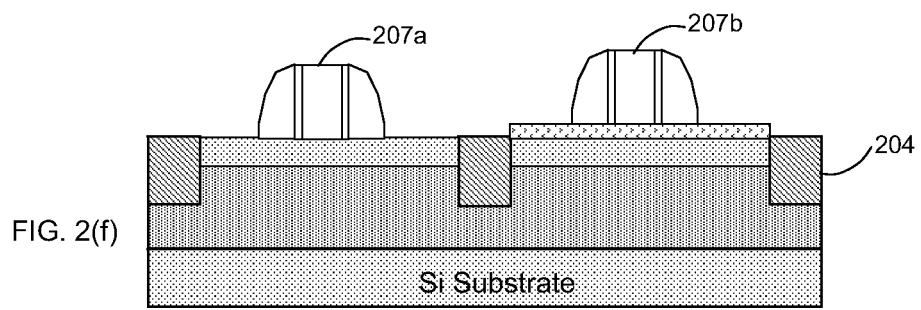
Figures 3A, 3B, 3C:
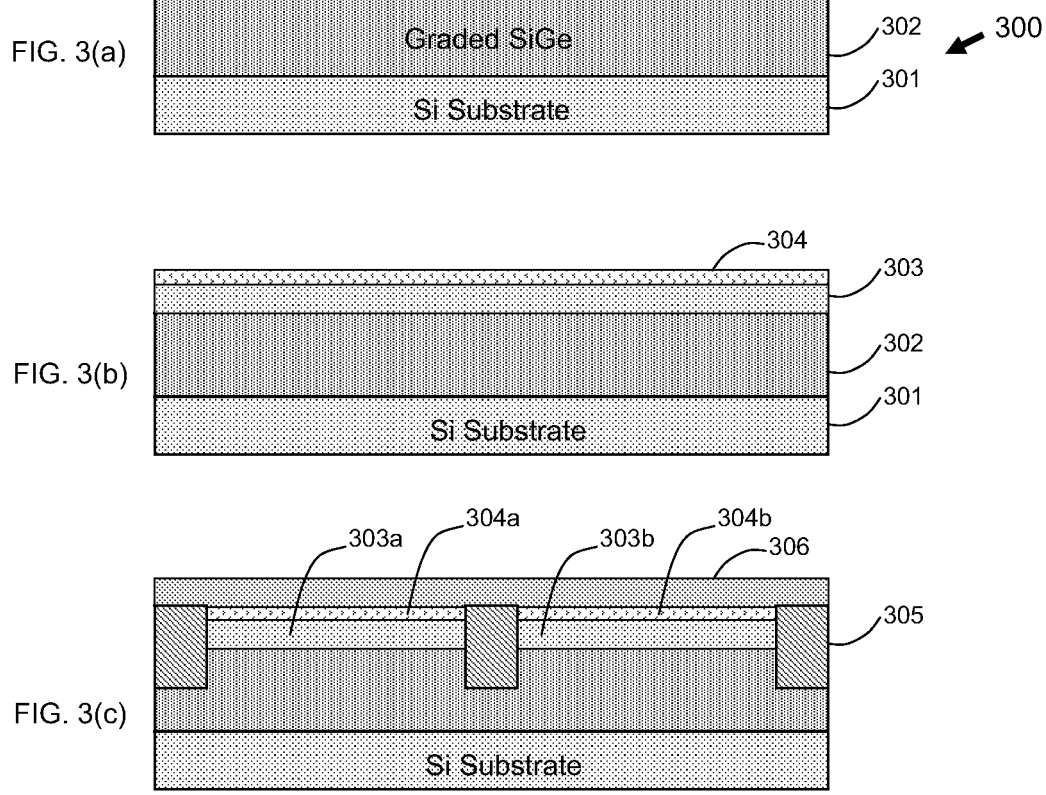
FIGS. 3(a)-3(f) are demonstrative illustrations of cross-sectional views of a method of forming semiconductor structure 300 according to yet another embodiment of the invention.

According to another embodiment, semiconductor structure 200 shown in FIG. 2(f) may be manufactured through an alternative approach or method as being demonstratively illustrated in FIGS. 3(a)-3(f). For example, the method of forming semiconductor structure 300, which is similar to structure 200, may initially include depositing a graded SiGe layer 302 on top of a silicon substrate 301 as shown in FIG. 3(a) and then forming a strained silicon layer 303 on top of graded SiGe layer 302 as shown in FIG. 3(b), similar to steps shown in FIG. 2(a)-2(b). Next, instead of taking steps to form a silicon-germanium layer 206 solely for the PFET forming area 203b, the method may include taking steps to form a silicon-germanium layer covering areas both for NFET and for PFET and thereafter removing the formed silicon-germanium layer that is on top of the NFET forming area.

More specifically, as is illustrated in FIG. 3(b), the method may include forming a SiGe layer which may be, for example, a carbon-doped SiGe (SiGe:C) layer 304 on top of strained silicon layer 303. The SiGe layer 304 may be required underneath the gate stack of a PFET transistor which is to be formed on top thereof.

Next, as being illustrated in FIG. 3(c), shallow trench isolations (STIs) 305 may be formed in the stack of films formed so far, including SiGe layer 304, strained silicon layer 303, and at least part of graded SiGe layer 302. STIs 305 may divide SiGe layer 304 into NFET and PFET forming areas 304a and 304b respectively and underneath strained silicon layer 303 into NFET and PFET forming areas 303a and 303b. Once NFET and PFET forming areas have been defined or separated by STI 305, steps may be taken to remove the SiGe layer 304a that is on top of the NFET forming strained silicon area 303a. In order to do this, the method may include forming or depositing a hard-mask layer 306 such as a HTO hard-mask layer to initially cover the entire SiGe layer 304 including one or more STIs 305 formed therein, as being illustrated in FIG. 3(c).

Figure 3D:
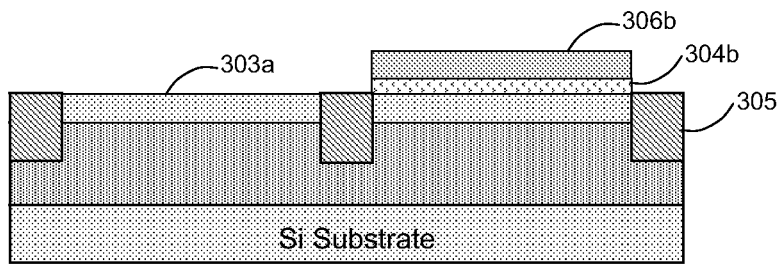

By applying a standard photolithographic patterning process, for example, the method then removes a portion of the formed hard-mask layer 306 to expose the SiGe layer 304 that covers NFET forming area, leaving only hard-mask layer 306b to cover PFET forming area. The exposed portion of SiGe layer 304a may be subsequently removed through any known or future developed processes such as, for example, a wet-etching process to expose underneath strained silicon layer 303a, which is now prepared for forming NFET thereupon, as is shown in FIG. 3(d).

Figure 3E:
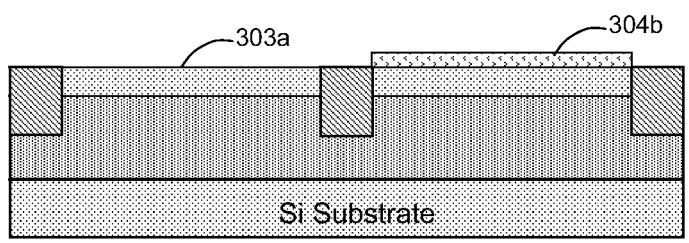
Figure 3F:
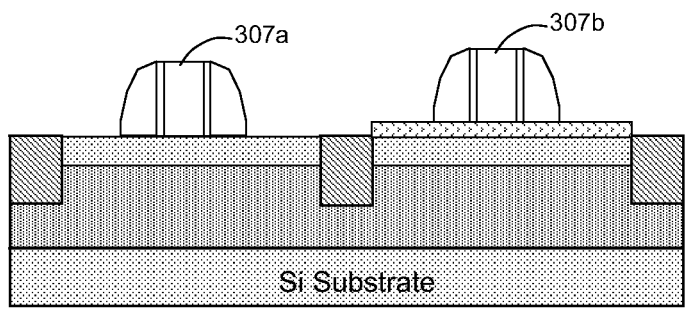

Next, the method proceeds to strip off hard-mask layer 306b to expose the underneath SiGe layer 304b. The surface of SiGe layer 304b may be prepared for forming PFET thereupon as is shown in FIG. 3(e). Following the above step, gate structures 307a and 307b may be formed either directly on top of strained silicon layer 303a (for NFET), or indirectly on top of strained silicon layer 303b via the channel SiGe layer 304b (for PFET) as shown in FIG. 3(f).

Figures 4A, 4B, 4C:
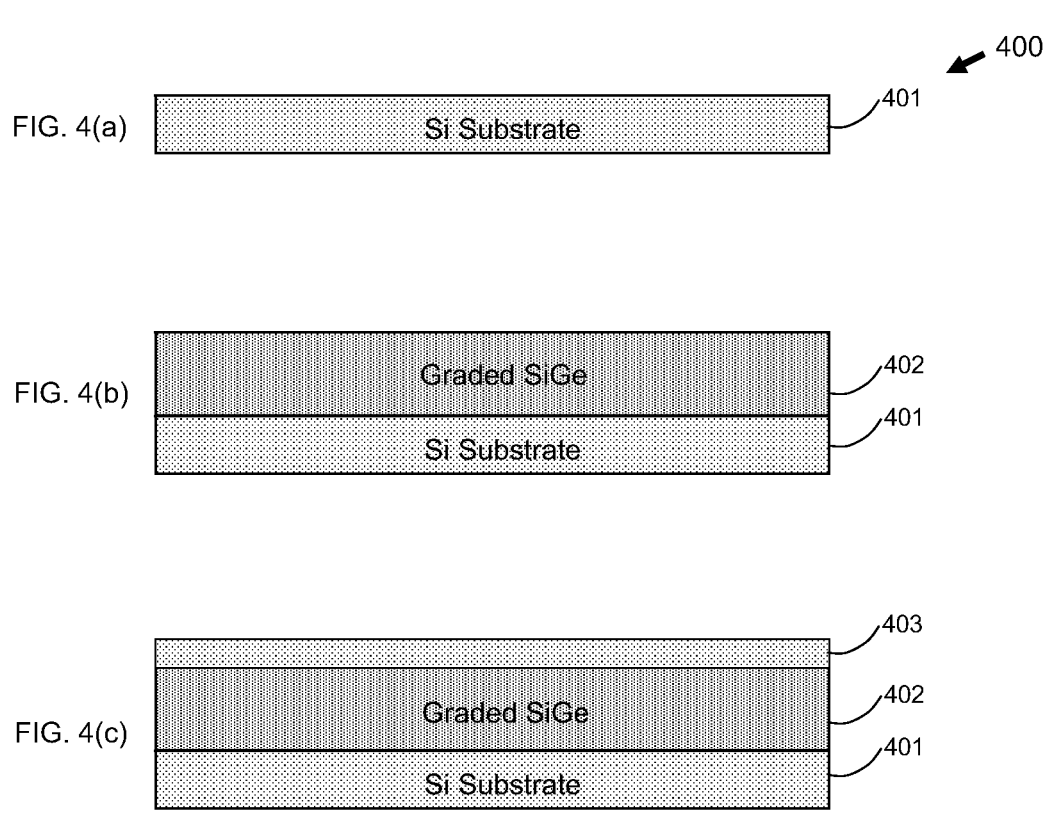
FIGS. 4(a)-4(f) are demonstrative illustrations of cross-sectional views of a method of forming semiconductor structure 400 according to another embodiment of the invention.

FIGS. 4(a)-4(f) are demonstrative illustrations of cross-sectional views of a method of forming semiconductor structure 400 according to another embodiment of the present invention. For example, the method may start with forming structure 400 on a silicon (Si) substrate 401 as shown in FIG. 4(a). On top of Si substrate 401, a graded silicon-germanium (SiGe) layer 402 with an increased Ge content toward the top of the SiGe layer 402 may be formed, as shown in FIG. 4(b), through a chemical vapor deposition process or other suitable processes. A strained silicon layer 403 may subsequently be formed on top of graded SiGe layer 402 as shown in FIG. 4(c).

Figure 4D:
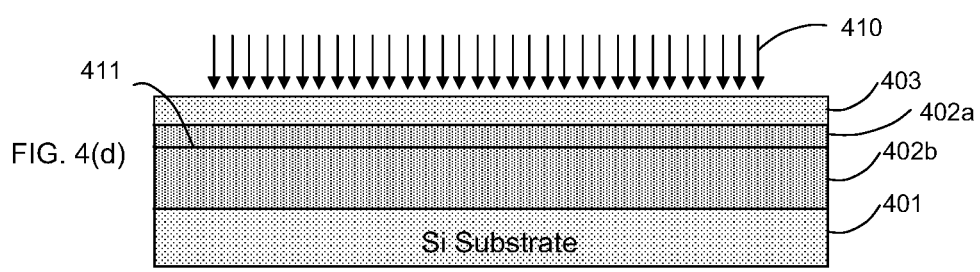

According to one embodiment of the present invention, at this stage of forming structure 400, a hydrogen implantation process 410 may be performed to form a perforated region 411 inside graded SiGe layer 402, that separates graded SiGe layer 402 into a top layer 402a and a bottom layer 402b as is shown in FIG. 4(d). The perforated region 411 formed by hydrogen implantation is rich in H+ ions and may be used to physically break apart the upper portion 402a from the lower portion 402b of graded SiGe layer 402, as being described below in more details.

Figure 4E:
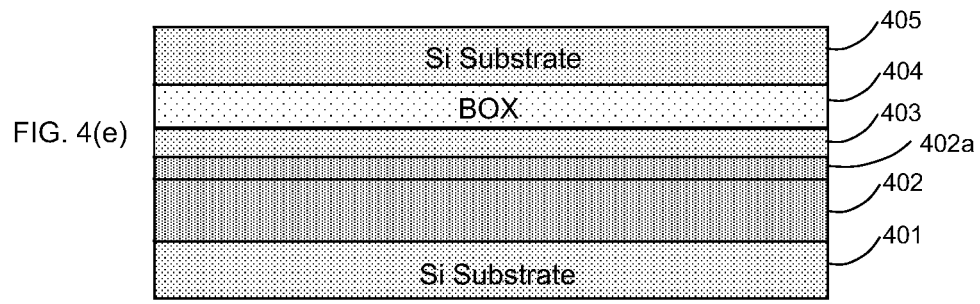
Figure 4F:
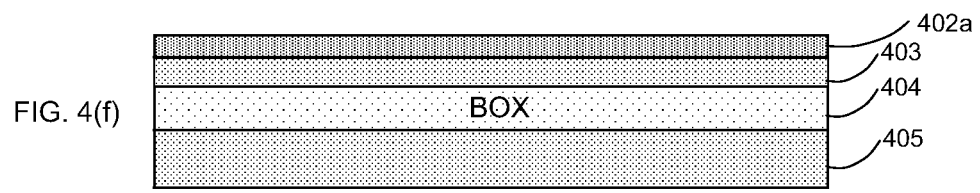

Following the hydrogen implantation 410, embodiment of the present invention may include providing a second silicon (Si) substrate 405 whereupon an oxide layer 404 is formed. The method further includes bonding the top surface of oxide layer 404 of the second Si substrate 405 to the strained silicon layer 403 that is formed on top of graded SiGe layer 402 in the first Si substrate 401, as shown in FIG. 4(e); flipping the bonded structure upside down; and breaking apart the rest of graded SiGe layer 402b from the top layer 402a along the implantation created perforated region 411. The structure created by the above process may be similar to that shown in FIG. 3(b) except channel SiGe layer 304 in FIG. 3(b) is now graded SiGe layer 402a in FIG. 4(f). After obtaining substrate structure 400 as shown in FIG. 4(f), embodiment of the present invention may further include steps, similar to those steps shown in FIG. 3(c)-3(f), to form a NFET gate structure directly on top of strained silicon layer 403 after removing graded SiGe layer 402a in the NFET forming region, and a PFET gate structure directly on top of graded SiGe layer 402a.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor structure comprising:
an n-type field-effect-transistor (NFET), the NFET having a gate being formed directly on top of a strained silicon layer, said strained silicon layer being formed directly on top of a layer of insulating material; and
a p-type field-effect-transistor (PFET), the PFET having a gate being formed on top of said strained silicon layer via a layer of silicon-germanium (SiGe),
wherein said NFET and PFET are separated by a shallow trench isolation (STI) formed inside said strained silicon layer.

2. The semiconductor structure of claim 1, wherein said strained silicon layer is a biaxial-strained silicon layer with approximately 0.8% tensile strain.

3. The semiconductor structure of claim 2, wherein said strained silicon layer has a thickness between about 4 nm and about 30 nm.

4. The semiconductor structure of claim 1, wherein said layer of insulating material is a layer of oxide.

5. The semiconductor structure of claim 1, wherein said layer of SiGe is doped with carbon.

6. The semiconductor structure of claim 1, wherein said layer of SiGe contains about fifty-five (55) atomic percentage of Ge content.

7. A semiconductor structure comprising:
an n-type field-effect-transistor (NFET) having a gate being formed directly on top of a strained silicon layer, said strained silicon layer being formed directly on top of a graded silicon-germanium (SiGe) layer; and
a p-type field-effect-transistor (PFET) having a gate being formed directly on top of a layer of silicon-germanium (SiGe), said layer of SiGe being directly on top of said strained silicon layer,
wherein said NFET and PFET are separated by a shallow trench isolation (STI) formed inside said strained silicon layer and said graded SiGe layer.

8. The semiconductor structure of claim 7, wherein said strained silicon layer is a biaxial-strained silicon layer with approximately 0.8% tensile strain.

9. The semiconductor structure of claim 8, wherein said strained silicon layer has a thickness between about 4 nm and about 30 nm.

10. The semiconductor structure of claim 7, wherein said graded SiGe layer has a germanium content that increase monolithically toward a surface that interfaces with said strained silicon layer.

11. The semiconductor structure of claim 10, wherein said graded SiGe layer has a thickness ranging from about 4 nm to about 80 nm, and a Ge content ranging from 10% to 70%.

12. The semiconductor structure of claim 7, wherein said layer of SiGe formed on top of said strained silicon layer is doped with carbon.

13. The semiconductor structure of claim 7, wherein said layer of SiGe contains about fifty-five (55) atomic percentage of Ge content.

14. The semiconductor structure of claim 7, wherein said layer of SiGe is epitaxially formed on top of said strained silicon layer.

15. A semiconductor structure comprising:
   at least one n-type field-effect-transistor (NFET) having a gate that is formed directly on top of a strained silicon layer; and
   at least one p-type field-effect-transistor (PFET) having a gate that is formed on top of said strained silicon layer via a layer of silicon-germanium (SiGe),
   wherein said strained silicon layer is formed on top of a base layer.

16. The semiconductor structure of claim 15, wherein said base layer is a graded silicon-germanium layer with a monolithically changing level of germanium (Ge) content.

17. The semiconductor structure of claim 16, wherein said level of Ge content of said graded SiGe layer ranges from about 10% to about 70%.

18. The semiconductor structure of claim 15, wherein said base layer is a layer of insulating material.

19. The semiconductor structure of claim 18, wherein said layer of insulating material is a layer of oxide.

20. The semiconductor structure of claim 15, wherein said strained silicon layer is a biaxial-strained silicon layer with approximately 0.8% tensile strain.

\* \* \* \* \*